United States Patent [19]
Ogawa

[11] Patent Number: 4,869,675
[45] Date of Patent: Sep. 26, 1989

[54] ELECTRICAL CONNECTOR FOR VEHICLES
[75] Inventor: Kikuo Ogawa, Shizuoka, Japan
[73] Assignee: Yazaki Corporation, Tokyo, Japan
[21] Appl. No.: 149,515
[22] Filed: Jan. 28, 1988
[30] Foreign Application Priority Data Feb. 12, 1987 [JP] Japan ................................. 62-17890

[51] Int. Cl.$^4$ ............................................. H01R 9/09
[52] U.S. Cl. ........................................ 439/76; 439/374
[58] Field of Search ................................... 439/76–78, 439/374, 81–83, 544, 709

[56] References Cited
U.S. PATENT DOCUMENTS
3,530,427 9/1970 Stauder et al. ...................... 439/374

Primary Examiner—P. Austin Bradley
Attorney, Agent, or Firm—Robbins & Laramie

[57] ABSTRACT

An electrical connector for vehicles in which a junction block and an electronic circuit unit are connected disengageably through connectors thereof which enable the connection. The connector of the unit enabling connection to the junction block is provided in such a manner as to project from a casing which forms a plane of reference for fitting the unit to engage with the junction block. By virtue of this arrangement, design and manufacture of a bus bar within the junction block is facilitated, thereby enhancing the reliability for the electric connection.

1 Claim, 5 Drawing Sheets

ELECTRICAL CONNECTOR FOR VEHICLES

BACKGROUND OF THE INVENTION

1. Field of the Invention

The present invention relates to an electrical connector for vehicles, in which a junction block (hereinafter abbreviated to "JB") and an electronic circuit unit (hereinafter abbreviated to "unit") are disengageably connected through connection between connectors.

2. DESCRIPTION OF RELATED ART

A plurality of JBs are in general used in the wiring of a wiring harness in a vehicle for the purpose of simplifying the wiring.

Such a JB generally comprises a main body and various electrical components such as connectors, relays and fuses at the ends of wires which are mounted on the main body. A typical JB also incorporates therein a bus bar through which electric circuits are connected in a branching manner. Recently, however, JBs have often been used in combination with units having various function circuits.

A unit of this type comprises a printed wiring board, various electronic components such as condensers, diodes, LSIs and ICs which are mounted on the board, and a casing accommodating these members and consisting of upper and lower parts. Some examples of function circuits of the type mentioned above are a circuit for producing a warning of a condition in which a seat belt is not fastened properly, a circuit for producing a warning of a condition in which a door is not fully closed, a wiper control circuit, and a defogger control circuit.

The connection between the JB and the unit has hitherto been attained by providing the JB with a connector enabling connection to the unit and the unit with a connector enabling connection to the JB, and bringing these connectors into fitting engagement with each other. The connector of the unit is constructed such that it does not project from a front face of the casing of the unit which forms a plane of reference for fitting the unit to engage with the JB. This arrangement is adopted for the following reasons. Since the connector of the unit is secured to the printed wiring board disposed inside the unit, if, conversely, the connector projects from the casing, the connector would be more vulnerable to external stresses to which it may be exposed during transportation and assembly of the unit, and there is a risk that the printed wiring board may be subjected to external forces that might cause deformation of the connection terminal, as well as formation of cracks at portions of the board where the circuits are soldered.

With this construction in which the connector of the unit is depressed from the fitting engagement reference plane toward the inside of the unit, the male terminal of the JB has to be provided in such a manner as to extend or rise from the bus bar toward the unit. The height of this extension increases to the same extent that the connector of the unit is depressed from the fitting engagement reference plane.

Thus, such a conventional arrangement for attaining connection between the JB and the unit necessitates maintaining a dimension sufficient for the height of the extension of the male terminal of the JB. This requirement, in turn, results in certain limitations on possible arrangements of the bus bar with respect to the circuits. Consequently, design and manufacture of the bus bar is difficult and the male terminal may not be well arranged, either. In this way, the conventional arrangement fails to guarantee a level of quality sufficient to ensure that stable electrical connection is provided between the JB and the unit.

SUMMARY OF THE INVENTION

It is an object of the present invention to eliminate the above-stated problems of the prior art and to provide an electrical connector for vehicles having such a construction that the printed wiring board and other components of the unit can be free from vulnerability to external forces and wherein the bus bar in the JB can be easily designed and manufactured, the construction of the electrical connector thus being capable of providing an increased level of reliability for the electric connection.

To this end, the present invention provides an electrical connector for vehicles comprising: a junction block; a unit having electronic circuit components, a printed wiring board on which the electronic circuit components are mounted, and a casing accommodating these members, the junction block having a connector enabling connection to the unit, the unit having a connector fixed to the casing and enabling connection to the junction block, the junction block and the unit being connected disengageably through connection between the connectors. According to the present invention, the connector of the unit enabling connection to the junction block is provided in such a manner as to project a front face of from the casing which forms a plane of reference for fitting the unit to engage with the junction block.

Further in accordance with the present invention, a protective wall surrounding the connector of the unit enabling connection to the junction block is formed on the casing.

DETAILED DESCRIPTION OF THE INVENTION

Figure 4:
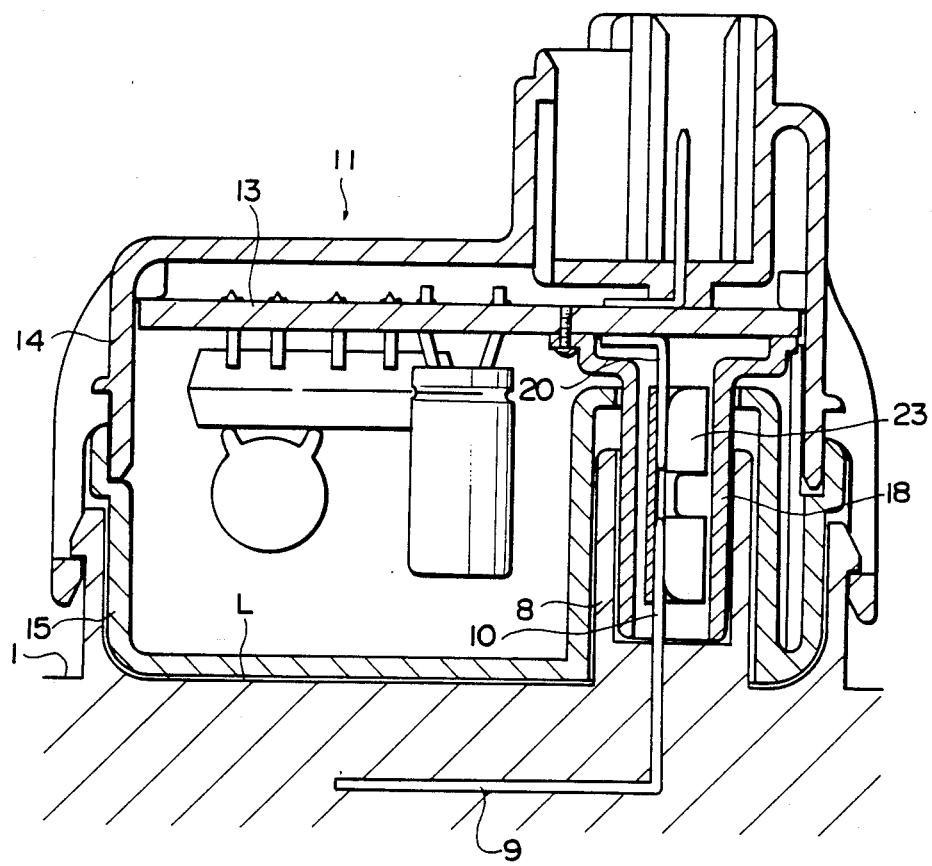
FIG. 4 is a sectional view showing the state of fitting engagement between a junction block and a unit, which is attainable by the prior art.

As shown in FIG. 4, the connection between a JB and a unit, of the type described before, has hitherto been attained by providing a JB 1 with a connector 8 enabling connection to a unit 11 and the unit 11 with a connector 18 enabling connection to the JB 1, and bringing these connectors 8 and 18 into fitting engagement with each other. The connector 18 of the unit 11 is constructed such that it does not project from a front face of a casing member 15 of the unit 11 which forms a plane L of reference for fitting the unit 11 to engage with the JB 1. This arrangement is adopted for the following reasons. Since the connector 18 of the unit 11 is secured to a printed wiring board 13 disposed inside the unit 11, if, conversely, the connector projects from the casing member 15, the connector 18 would be more vulnerable to external stresses to which it may be exposed during transportation and assembly of the unit 11, and there is a risk that the printed wiring board 13 may be subjected to external forces that might cause deformation of a connection terminal 20, as well as formation of cracks at portions of the board 13 where the circuits are soldered As shown in FIG. 4, the junction block 1 has a bus bar 9 and a male terminal 10 formed continuous with the bus bar 9 and extending or rising therefrom. Reference numeral 23 denotes a female-female junction terminal.

Figure 5:
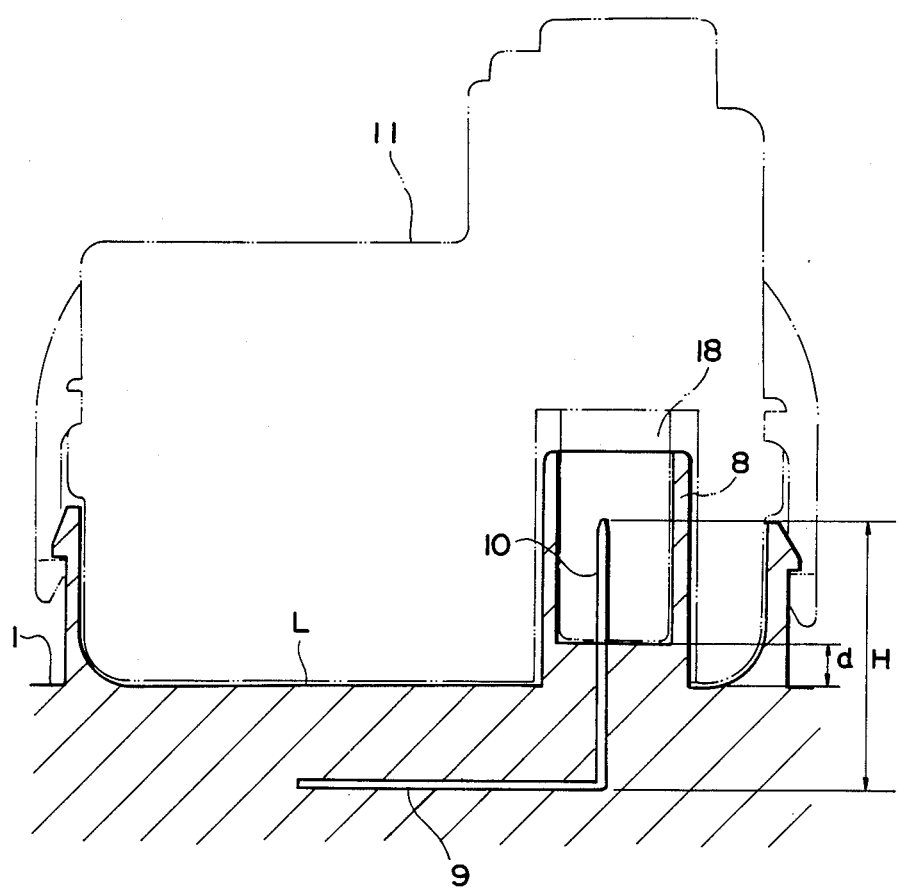
FIG. 5 is a partially sectional view showing the relationship in the prior art as between the unit and the height of the extension of the male terminal from the bus bar of the junction block.

With this construction in which the connector 18 of the unit 11 is depressed from the fitting engagement reference plane L, i.e, from a front surface of the casing member 15 which registers with the mating surface when the JB 1 and the unit 11 are connected, toward the inside of the unit 11, the male terminal 10 of the JB 1 has to be provided in such a manner as to extend or rise from the bus bar 9 toward the unit 11. As shown in FIG. 5, the height H through which this extension rises increases to the same extent d that the connector 18 of the unit 11 is recessed from the fitting engagement reference plane L. In consequence, such a conventional arrangement for attaining connection between the JB and the unit involves the problems stated before.

Figure 1:
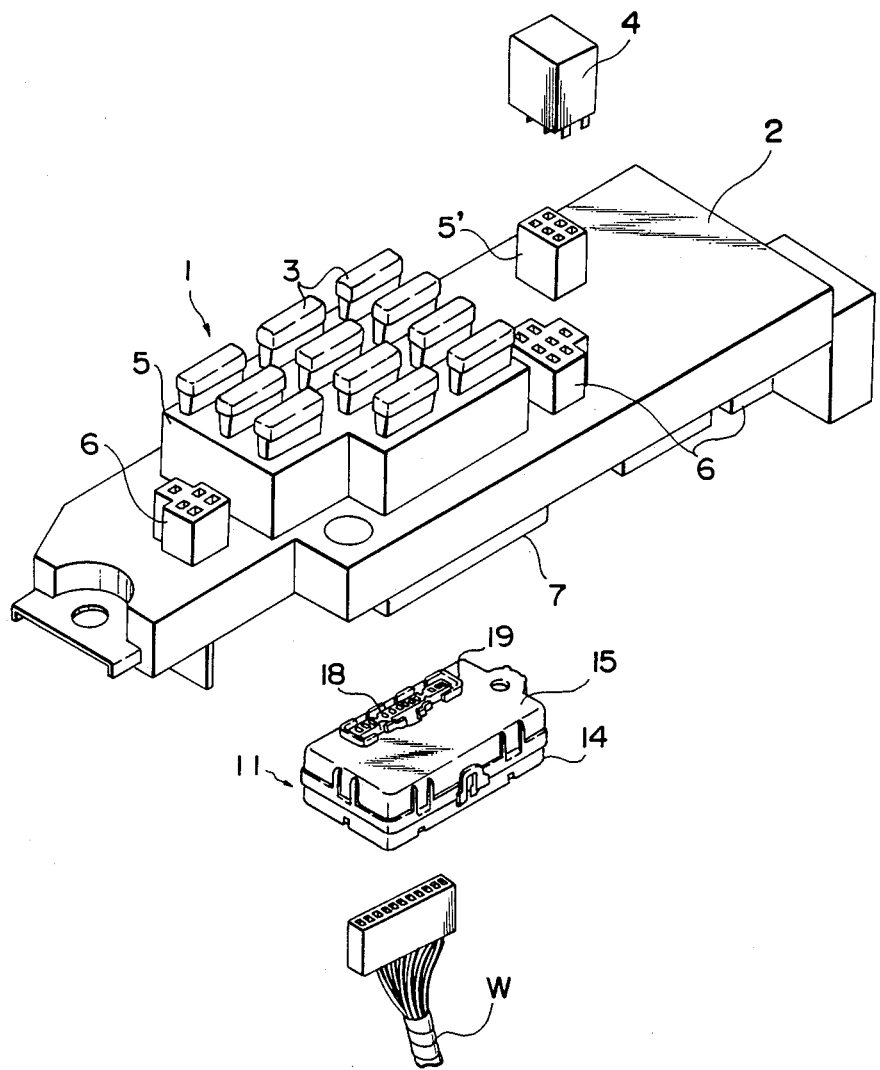
FIG. 1 is a perspective view of an electrical connector for vehicles in accordance with one embodiment of the present invention, in which a junction block and a unit of the connector are shown in the state of being separated from each other.
Figure 2:
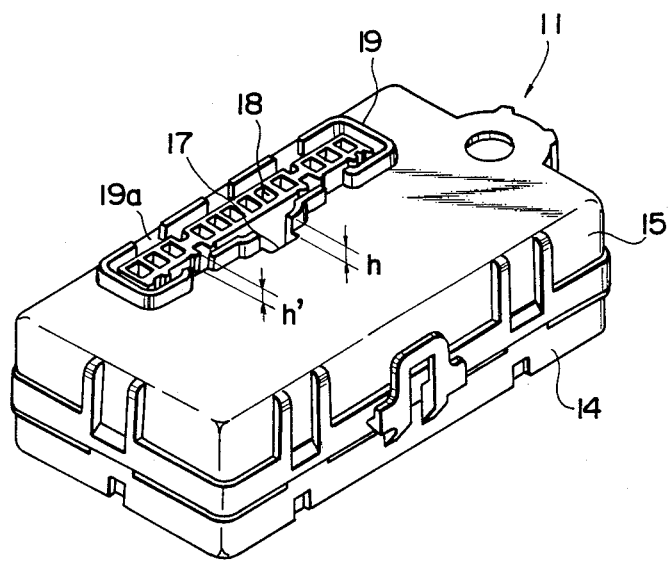
FIG. 2 is a perspective view of the unit drawn to an enlarged scale.
Figure 3:
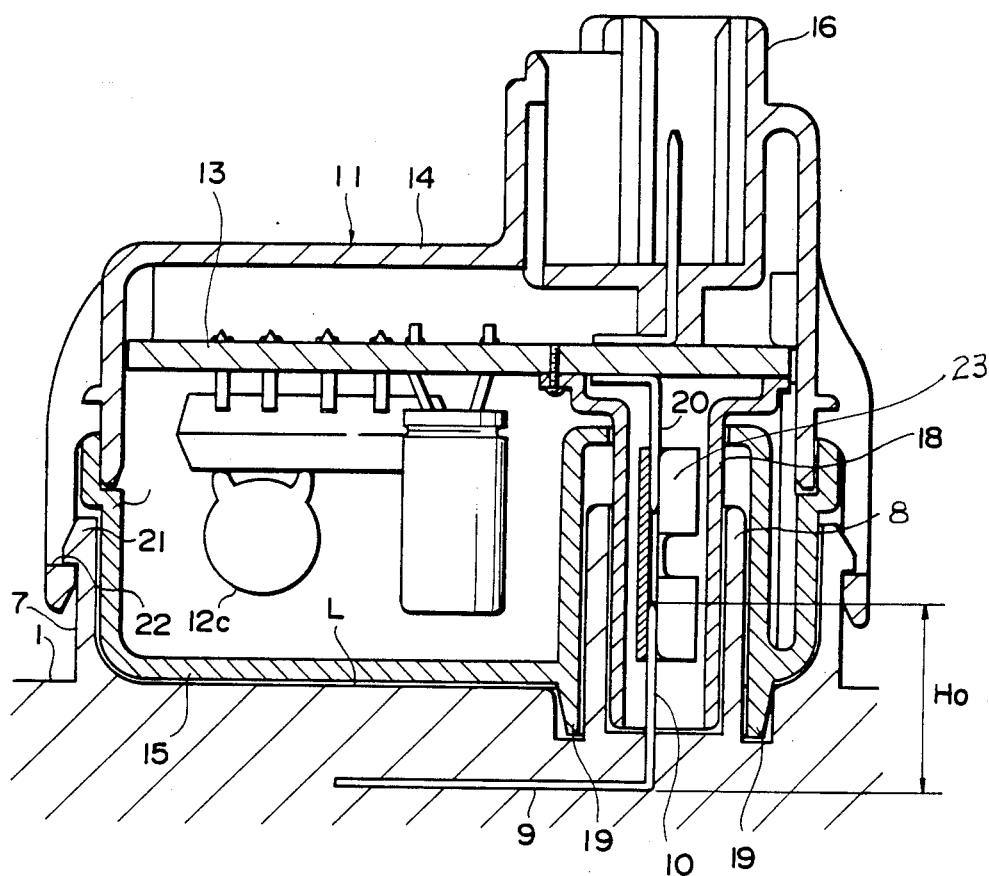
FIG. 3 is a sectional view showing the state in which the unit is in fitting engagement with the junction block.

FIGS. 1 to 3 illustrate one embodiment of the present invention. Referring to these figures, reference numeral 1 denotes a JB 1 having a main body 2. The JB 1 has on the upper surface sockets 5 and 5' for mounting electric components such as fuses 3 and a relay 4, as well as a connector 6 through which the JB 1 can be connected to a wiring harness The main body 2 of the JB 1 has on the lower surface another connector 6 and a frame 7 defining a receptacle for receiving a unit. A connector 8 enabling connection to the unit is disposed within the receptacle frame 7. A male terminal 10 extends from a bus bar 9 disposed within the JB 1 to the inside of the connector 8.

A unit 11 comprises electronic components such as a condenser 12a, an LSI 12b and a resistor 12c, a printed wiring board 13 on which these components are mounted, and a casing accommodating these members and consisting of parts 14 and 15 which are respectively disposed on the upper and lower side of the casing, as viewed in FIG. 3.

The upper part 14 of the casing has a connector 16 through which a wiring harness W can be connected to the unit 11. The lower part 15 of the casing has on the lower surface an aperture 17 formed therein, and a connector 18 enabling connection to the JB 1, which is secured to the printed wiring board 13 by screws, projects through the aperture 17 and from the surface of the part 15 of the casing. A protective wall 19 is formed integrally with the part 15 of the casing along the edge of the aperture 17, in such a manner as to surround the connector 18. Although in the illustrated embodiment, gaps 19a are formed in the protective wall 19, the wall 19 may alternatively be such that it is completely continuous around the connector 18. The height h of the protective wall 19 from the surface of the casing is set at a value greater than the height h' of the connector 18 from the same. A connection terminal 20 of the unit 11 extends from the printed wiring board 13.

Referring specifically to FIG. 3, connection between the JB 1 and the unit 11 will be described hereunder.

When the unit 11 is fitted into the receptacle defined by the frame 7 of the JB 1, the unit 11 and the JB 1 are locked by virtue of engagement between a locking pawl 21 formed on the frame 7 of the JB 1 and locking grooves 22 formed in extending portions of the upper part 14 of the unit 11.

Simultaneously, the connector 18 of the unit 11 and the connector 8 of the JB 1 are brought into fitting engagement with each other, so that the male terminal 10 of the JB 1 and the connection terminal 20 of the unit 11 are connected through a female-female junction terminal 23.

The arrangement of the connector 18 of the unit 11 is such that the connector 18 projects from a front face of the surface of the lower part 15 of the casing, i.e., from a plane L of reference for fitting the unit 11 to engage with the JB 1, so that the connector 18 is able to project into the JB 1 when the unit 11 is connected to the JB 1. By virtue of this arrangement, the height Ho of the male terminal 10 from the bus bar 9 can be reduced when compared with that of the conventional arrangement shown in FIG. 5.

Therefore, design of the bus bar 9 can be facilitated and the male terminal 10 can be easily arranged.

In addition, when the connector 18 of the unit 11 is being brought into fitting engagement, the protective wall 19 acts as a guide wall, thereby enabling the connector 18 to be connected to the connector 8 of the JB 1 smoothly without being exposed to any oblique stresses.

As described above, with the electrical connector for vehicles in accordance with the present invention, the printed wiring board within the unit can be free from vulnerability to external forces, thereby eliminating the risk of the terminal being deformed, as well as the risk of any cracks being formed at soldered portions, and also facilitating design and manufacture of the bus bar within the JB. Therefore, the electrical connector for vehicles in accordance with the present invention can provide an increased level of reliability for the electric connection.

What is claimed is:

1. An electrical connector for vehicles comprising: a junction block; an electronic circuit unit having electronic circuit components, a printed wiring board on which said electronic circuit components are mounted, and a casing accommodating these members, said junction block having a connector for enabling connection to said electronic circuit unit, said electronic circuit unit having a connector fixed to said casing for enabling connection to said junction block, said junction block and said electronic circuit unit being connected disengageably through connection between said connector of said junction block enabling connection to said unit and said connector of said unit enabling connection to said junction block, wherein said connector of said electronic circuit unit enabling connection to said junction block is provided in such a manner as to project outwardly from a reference plane defined by a front face of said casing for coupling said electronic circuit unit with said junction block, said casing comprising a protective wall spaced from said connector of said electronic circuit unit that extends generally transversely from said reference plane along a portion of said casing front face for protecting said connector of said electronic circuit unit, said protective wall being formed on said casing in such a manner as to surround the connector where the connector projects from said casing.

* * * * *